US011025347B2

(12) United States Patent
Zeng et al.

(10) Patent No.: US 11,025,347 B2
(45) Date of Patent: Jun. 1, 2021

(54) COMPENSATING FOR CHANNEL DISTORTION DURING CONTACTLESS COMMUNICATION

(71) Applicant: Apple Inc., Cupertino, CA (US)

(72) Inventors: Xinping Zeng, San Jose, CA (US); Vusthla Sunil Reddy, Cupertino, CA (US); Peter M. Agboh, Burlingame, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/921,421

(22) Filed: Jul. 6, 2020

(65) Prior Publication Data

US 2020/0336220 A1    Oct. 22, 2020

Related U.S. Application Data

(63) Continuation of application No. 16/356,774, filed on Mar. 18, 2019, now Pat. No. 10,707,972.

(51) Int. Cl.
*H04B 15/00* (2006.01)
*H03H 21/00* (2006.01)
(Continued)

(52) U.S. Cl.
CPC ......... *H04B 15/00* (2013.01); *H03H 21/0012* (2013.01); *H04B 17/309* (2015.01); *H04B 5/0075* (2013.01)

(58) Field of Classification Search
CPC ...... H04B 17/309; H04B 5/0031; H04B 5/00; H04B 5/0025; H04B 15/00; H04W 4/80; H04M 1/7253
See application file for complete search history.

(56) References Cited

U.S. PATENT DOCUMENTS 8,391,430 B2 * 3/2013 Mihota ............. H04L 25/03057
375/350
9,100,257 B2 * 8/2015 Jain .................... H03H 21/0012
(Continued)

FOREIGN PATENT DOCUMENTS

EP        1107490 A1    6/2001
EP       24930774 A2    8/2012

*Primary Examiner* — Devan A Sandiford
(74) *Attorney, Agent, or Firm* — Fletcher Yoder PC

(57) ABSTRACT

Systems, methods, and devices are provided for compensating for distortion of a contactless communication channel. The electronic device may include a radio frequency system that itself includes antenna to transmit and receive data using near-field communication (NFC) and an NFC signal processing circuitry. The NFC signal processing circuitry may receive an NFC signal via a communication channel formed between the electronic device and another electronic device and may determine a baseband reference waveform associated with the electromagnetic NFC signal and may determine an error between a portion of the electromagnetic NFC signal and the baseband reference waveform. Furthermore, the NFC signal processing circuitry may determine whether the error is outside of an acceptable error threshold range and, in response to the error being outside of the acceptable error threshold range, train a filter response of the NFC signal processing circuitry to estimate the communication channel.

20 Claims, 11 Drawing Sheets

(51) Int. Cl.
  *H04B 17/309* (2015.01)
  *H04B 5/00* (2006.01)

(56) References Cited

U.S. PATENT DOCUMENTS

| | | | |
|---|---|---|---|
| 10,148,339 B2* | 12/2018 | Jovanovic | H04B 7/15528 |
| 10,880,767 B2* | 12/2020 | Charpentier | H04W 24/08 |
| 2002/0097668 A1* | 7/2002 | Izumi | H04L 5/0044 |
| | | | 370/208 |
| 2003/0119468 A1* | 6/2003 | Meehan | H04B 7/0811 |
| | | | 455/277.2 |
| 2003/0161487 A1* | 8/2003 | Husted | H04B 15/00 |
| | | | 381/94.5 |
| 2006/0251016 A1* | 11/2006 | Lee | H04L 1/0021 |
| | | | 370/329 |
| 2007/0133608 A1* | 6/2007 | Isambart | H04N 17/004 |
| | | | 370/484 |
| 2007/0238418 A1* | 10/2007 | Mizusawa | H04W 52/241 |
| | | | 455/69 |
| 2008/0112519 A1 | 5/2008 | Jung et al. | |
| 2009/0190756 A1* | 7/2009 | Hardacker | H04N 19/85 |
| | | | 380/210 |
| 2010/0002750 A1* | 1/2010 | Hardacker | H04N 21/4382 |
| | | | 375/133 |
| 2010/0079261 A1* | 4/2010 | Goto | H04B 5/0075 |
| | | | 340/10.51 |
| 2010/0172427 A1* | 7/2010 | Kleider | H04L 25/0232 |
| | | | 375/260 |
| 2011/0149929 A1* | 6/2011 | Kleider | H04L 27/2613 |
| | | | 370/338 |
| 2013/0303098 A1* | 11/2013 | Carlsson | H04B 17/336 |
| | | | 455/226.1 |
| 2014/0073241 A1* | 3/2014 | Luong | H04B 5/0031 |
| | | | 455/41.1 |
| 2015/0256966 A1* | 9/2015 | Mori | G06F 11/0709 |
| | | | 455/41.2 |
| 2017/0038453 A1* | 2/2017 | Hussey | G01R 31/2834 |
| 2017/0098149 A1* | 4/2017 | Kesler | H02J 50/80 |
| 2017/0111188 A1* | 4/2017 | Deng | H03F 3/245 |
| 2019/0222263 A1* | 7/2019 | Graffouliere | H04W 4/80 |
| 2019/0369217 A1* | 12/2019 | Policht | G01S 7/4865 |
| 2020/0021299 A1* | 1/2020 | Cohen | H03J 1/0091 |
| 2020/0187032 A1* | 6/2020 | Charpentier | H04B 5/0075 |
| 2020/0235968 A1* | 7/2020 | Luzzi | H04L 27/2613 |

* cited by examiner

COMPENSATING FOR CHANNEL DISTORTION DURING CONTACTLESS COMMUNICATION

CROSS-REFERENCE TO RELATED APPLICATIONS

This application is a continuation of and claims priority to U.S. application Ser. No. 16/356,774, filed Mar. 18, 2019, entitled, "Compensating for Channel Distortion during Contactless Communication," the disclosure of which is incorporated in its entirety for all purposes.

BACKGROUND

The present disclosure relates generally to contactless communication, such as near-field communication (NFC), between electronic devices. More particularly, the present disclosure relates to compensating for distortion of a contactless communication channel.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as smartphones and computers, often include a radio frequency system to facilitate wireless communication of data with other electronic devices. In particular, the radio frequency system may include a radio frequency transceiver that emits wireless signals of a radio frequency to the other electronic devices to facilitate the contactless communication. For example, a near-field communication (NFC) transceiver module, such as an active reader, may communicate information with another NFC device, such as a passive tag. In some cases, however, NFC communication between two NFC devices may become distorted.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to compensating for distortion of a contactless communication channel, such as a near-field communication (NFC) channel, which could arise from movement during coupling between contactless communication devices. As an example, an active NFC device (e.g., active NFC reader, peer-to-peer initiator) and a receiving NFC device (e.g., e.g., passive NFC tag, peer-to-peer tag) may communicate information with each other via a communication channel formed between the devices once the devices have been electromagnetically coupled together. In some cases, a portion (e.g., preamble) of the communicated information may identify the type of contactless communication protocol (e.g., NFC-A, NFC-B, NFC-F, NFC-V) that should be used by the receiving electronic device to appropriately decipher the communicated information.

However, when environmental factors (e.g., material coupling, movement) cause detuning (e.g., distortion) of the communication channel, information transmitted via the distorted communication channel may also become distorted and may not be decipherable by the receiving electronic device. For example, the preamble may be distorted and the receiving electronic device may be unable to determine which contactless communication protocol should be used to decipher the communicated information. As such, communication between the devices may fail.

To reduce communication failure in contactless communication systems, the receiving electronic device's filter response may be dynamically adjusted using preamble-based channel estimation that compensates for the communication channel distortion. In some embodiments, the receiving electronic device may implement radio frequency receiver architecture that includes a mode detection correlator and an adaptive filter. The mode detection correlator may receive a digitized signal emitted by, for example, the active NFC device. The mode detection correlator may evaluate a digitized preamble of the digitized signal to determine the contactless communication protocol encoded by the digitized preamble. The mode detection correlator may then transmit an appropriate reference signal (e.g., non-distorted preamble) associated with the encoded contactless communication protocol to the adaptive filter.

In addition to receiving the reference signal, the adaptive filter may also receive a copy of the digitized preamble. Based on the reference signal and the digitized preamble, the adaptive filter may determine whether the digitized preamble, and hence the communication channel, have been distorted. In some embodiments, when the communication channel is distorted, the filter response may be dynamically adjusted (e.g., training filter coefficients) based on the reference signal and the digitized preamble to remove the channel distortion (e.g., estimate the channel). Once trained, the adaptive filter may compensate for channel distortion encoded in received digitized signals and may transmit the relatively distortion-free signals for further processing and deciphering by the receiving electronic device. This may reduce communication failure caused by communication channel distortion.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
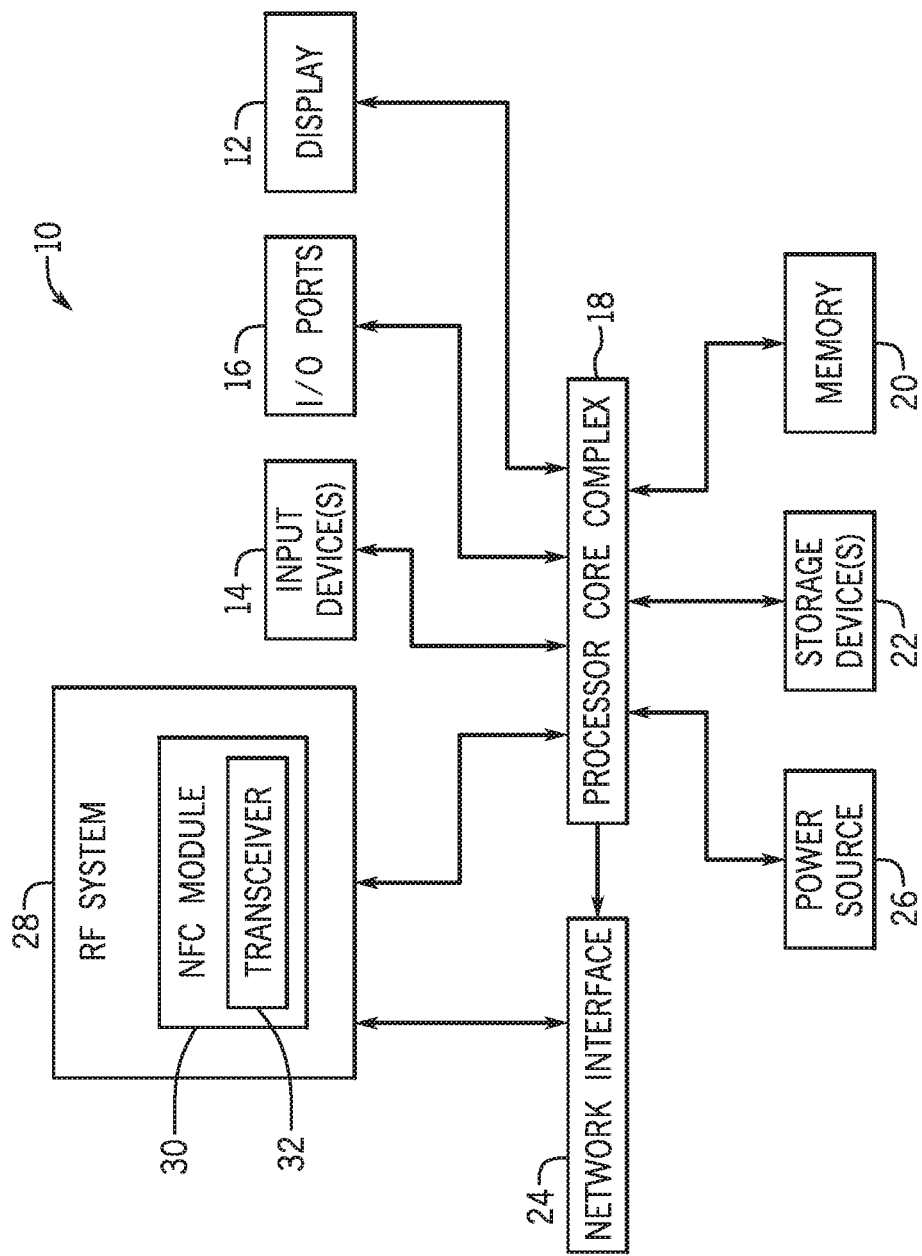
FIG. 1 is a block diagram of an electronic device with a radio frequency system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to radio frequency (RF) systems used to facilitate wireless communication of data between electronic devices and/or with a network. For example, the radio frequency system may wirelessly communicate data by transmitting wireless signals (e.g., electromagnetic waves) modulated in accordance with a communication protocol, such as a personal area network (e.g., Bluetooth network), a local area network (e.g., an 802.11x Wi-Fi network), a wide area network (e.g., 4$^{th}$ Generation (G), 5G, sub-6G, or LTE cellular network), and/or contactless communication (e.g., near-field communication (NFC)).

In particular, to enable contactless communication, the radio frequency system of the electronic devices may include a radio frequency transceiver, such as a standalone near-field communication (NFC) module. Although the following embodiments are discussed in terms of near-field communication, it should be appreciated that any communication protocol subject to channel distortion, such as radio-frequency identification (RFID) based technology, is contemplated in the present disclosure.

Briefly, a near-field communication (NFC) device may be implemented as an active NFC device (e.g., active NFC reader, peer-to-peer initiator), a passive NFC device (e.g., passive NFC tag, peer-to-peer tag), or selectively in an NFC device capable of both active NFC and passive NFC modes. The active NFC device may act as power source for the passive NFC device by supplying electrical energy via electromagnetic NFC waves of a radio frequency.

In some embodiments, the passive NFC device may be implemented with a limited power source as compared to the active NFC device to facilitate reducing implementation associated costs, such as component count and/or physical footprint. For example, the passive NFC device may often operate without using a dedicated power source or with a limited power source. Instead, the passive NFC device may be paired with the active NFC device and may operate using the electrical energy received (e.g., harvested) via the electromagnetic NFC waves transmitted by the active NFC device.

To pair the active NFC device to the passive NFC device, the active NFC device and the passive NFC device may be electromagnetically coupled to form a communication channel exclusive to the devices. As an example, the active NFC device and the passive NFC device may each include an antenna to facilitate emitting and receiving the electromagnetic NFC waves. When the active NFC device is in an object-detection mode, inductor(s) of the active NFC device antenna may periodically emit impulse electromagnetic NFC waves to determine whether another NFC device, such as the passive NFC device, is within proximity. The impulse electromagnetic NFC waves may induce (e.g., inductive coupling) a voltage and/or current in inductor(s) of the passive NFC device antenna, causing the passive NFC device to transmit a discovery acknowledgement to the active NFC device.

Once a potential passive NFC device is discovered, the active NFC device may enter a polling mode to charge the potential passive NFC device and to confirm whether the potential passive NFC device is indeed a passive NFC device. As such, during the polling mode, the antenna of the active NFC device may emit relatively longer duration electromagnetic NFC waves to further cause inductive coupling between the devices. When the potential passive NFC device is actually the passive NFC device, a communication channel may form between the active NFC device and the passive NFC device due to the inductive coupling, thereby communicatively tying the NFC devices together. The communication channel may be a logical connection over a multiplexed medium, such as a radio frequency band, and may act as a pathway for communication between the active NFC device and the passive NFC device.

Once the communication channel has formed, the active NFC device may enter a reader (e.g., transaction) mode and may use the communication channel to transmit data. For example, the active NFC device (e.g., rail station ticket kiosk) may emit electromagnetic NFC waves modulated based at least in part on the data to the passive NFC device (e.g., smartphone) via the communication channel.

In some cases, the electromagnetic NFC waves emitted during one or more of the NFC operational modes may include a preamble sequence. The preamble may include a reference baseband signal that, for example, synchronizes transmission and read times between the active NFC device and the passive NFC device. Further, the preamble may define transmission criteria to ensure that the passive NFC device interprets the electromagnetic NFC waveform as intended. For example, the preamble used in NFC technology may designate whether the electromagnetic NFC waves should be interpreted using NFC-A (e.g., type A), NFC-B (e.g., type B), NFC-F (e.g., type F), or NFC-V (e.g., type V) protocols. As such, the reference baseband signal for each NFC protocol may be different. Each time the preamble is recognized by the passive NFC device, communication (e.g., transaction) may occur successfully.

In some instances however, environmental factors may detune (e.g., distort) the communication channel by causing faulty coupling between the NFC devices. For example, housing material of the active NFC device and the passive NFC device, antenna placement of the active NFC device, movement of the NFC devices relative to each other, and/or a user's interaction with the passive NFC device may interfere with the inductive coupling between the NFC devices, resulting in alterations (e.g., distortion) of the original channel characteristics.

The distortion of the communication channel may result in the distortion of the electromagnetic NFC waves transmitted via the communication channel. Such distorted electromagnetic NFC waves may not be decipherable by the passive NFC device, leading to communication failure. For example, when the preamble is distorted, the passive NFC device may be unable to appropriately decode the NFC protocol that should be used to properly interpret the received signals.

Because the passive NFC device traditionally has limited energy and processing power due to reliance on energy harvested from the active NFC device, relatively simple and crude signal compensation may have been used in previous solutions to compensate for the communication channel distortion. In some embodiments however, the passive NFC device, such as a smartphone, may have a designated power source that enables implementation of a digital signal processing (DSP) based compensation.

Accordingly, the present disclosure provides systems and techniques that compensate for the communication channel distortion caused by faulty coupling between the active NFC device and the passive NFC device by dynamically adjusting a radio frequency filter response using a preamble-based channel estimation. In some embodiments, receiver architecture of the passive NFC device may include an analog portion and a DSP portion. The analog portion may digitize a received electromagnetic NFC wave that may include the preamble. The digitized signal may be transmitted to the DSP portion.

In some embodiments, the DSP portion may include a mode detection correlator and an adaptive filter. The mode detection correlator may determine the NFC protocol type encoded in the digitized preamble and may transmit a baseband reference signal (e.g., non-distorted preamble) associated with the NFC protocol encoded in the digitized preamble to the adaptive filter. The adaptive filter may compare the digitized preamble and the baseband reference signal to determine whether the digitized preamble, and hence the communication channel, have been distorted. In some embodiments, when the communication channel is distorted, the filter response may be dynamically adjusted (e.g., training filter coefficients) based on the reference signal and the digitized preamble to remove the channel distortion (e.g., adaptive filter output converges to a channel estimate). That is, the filter response may be adjusted to better match the digitized preamble to the baseband reference signal. For example, the adaptive filter may be a 4-tap or flexible n-tap filter whose filter coefficients are trained based on the difference between the digitized preamble and the baseband reference signal. A filter of any other suitable number of taps may be used.

Once trained, the adaptive filter may compensate for channel distortion encoded in received digitized signals and may transmit the relatively distortion-free signals for further processing and deciphering by the passive NFC device. As such, the present embodiments may reduce communication failure caused by communication channel distortion. Additional details with regard to compensating for communication channel distortion using the embodiments described herein are detailed below with reference to FIGS. 1-13.

As such, an embodiment of an electronic device 10 that includes a radio frequency system 28 is shown in FIG. 1. As will be described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In the depicted embodiment, the electronic device 10 includes the electronic display 12, one or more input devices 14, one or more input/output (I/O) ports 16, a processor core complex 18 having one or more processor(s) or processor cores, memory 20 that may be local to the device 10, a main memory storage device 22, a network interface 24, a power source 26, and a radio frequency (RF) system 28. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the memory 20 and the main memory storage device 22 may be included in a single component.

As depicted, the processor core complex 18 is operably coupled with memory 20 and the main memory storage device 22. In some embodiments, the memory 20 and/or the main memory storage device 22 may be tangible, non-transitory, computer-readable media that stores instructions executable by the processor core complex 18 and/or data to be processed by the processor core complex 18. For example, the memory 20 may include random access memory (RAM) and the main memory storage device 22 may include read only memory (ROM), rewritable non-volatile memory such as flash memory, hard drives, optical discs, and/or the like.

In some embodiments, the processor core complex 18 may execute instructions stored in memory 20 and/or the main memory storage device 22 to perform operations, such as signaling the NFC module 30 to emit electromagnetic NFC waves. As such, the processor core complex 18 may include one or more general purpose microprocessors, one or more application specific processors (ASICs), one or more field programmable logic arrays (FPGAs), or any combination thereof.

Further, as depicted, the processor core complex 18 is operably coupled with I/O ports 16, which may enable the electronic device 10 to interface with various other electronic devices. For example, a portable storage device may be connected to an I/O port 16, thereby enabling the processor core complex 18 to communicate data with a portable storage device.

Furthermore, the processor core complex 18 is also operably coupled to the power source 26, which may provide power to the various components in the electronic device 10. The power source 26 may include any suitable source of energy, such as a rechargeable lithium polymer (Li-poly) battery and/or an alternating current (AC) power converter.

Additionally, the processor core complex 18 may be operably coupled with the input devices 14. In some embodiments, the input device 14 may facilitate user interaction with the electronic device 10, for example, by receiving user inputs. Thus, the input devices 14 may include a button, a keyboard, a mouse, a trackpad, and/or the like. Additionally, in some embodiments, the input devices 14 may include touch-sensing components in the electronic display 12. In such embodiments, the touch-sensing components may receive user inputs by detecting occurrence and/or position of an object touching the surface of the electronic display 12.

The electronic display 12 may use, for example, organic light-emitting diode (OLED) or liquid-crystal display (LCD) technology to present visual representations of information by display images such, as a graphical user interface (GUI) of an operating system, an application interface, a still image, or video content. As described above, the electronic display 12 may display the images based on image content received from memory 20, a storage device (e.g., main memory storage device 22 and/or an external storage device), and/or another electronic device 10, for example, via the network interface 24 and/or the I/O ports 16. The electronic display 12 may also include touch components that enable user inputs to the electronic device 10 by detecting occurrence and/or position of an object touching its screen (e.g., surface of the electronic display 12).

Additionally, as depicted, the processor core complex 18 is operably coupled with the network interface 24. Using the network interface 24, the electronic device 10 may communicatively couple to a communication network and/or other electronic devices. For example, the network interface 24 may connect the electronic device 10 to a personal area network (PAN), such as a Bluetooth network, a local area network (LAN), such as an 802.11x Wi-Fi network, and/or a wide area network (WAN), such as a 4G or LTE cellular network. In this manner, the network interface 24 may enable the electronic device 10 to transmit image content to a network and/or receive image content from the network for display on the electronic display 12.

The network interface 24 may be operably coupled to the radio frequency system 28. As described above, the radio frequency system 28 may facilitate wireless communication of data with another electronic device and/or a network. For example, the radio frequency system 28 may enable the electronic device 10 to communicatively couple to a personal area network (e.g., Bluetooth network), a local area network (e.g., an 802.11x Wi-Fi network), a wide area network (e.g., 4$^{th}$ Generation (G), 5G, sub-6G, or LTE cellular network), and/or contactless communication (e.g., near-field communication (NFC)).

In particular, the radio frequency system 28 may be tailored to better support wireless transmission via certain wireless technologies. In one embodiment, the radio frequency system 28 may include hardware and/or software that supports contactless communication, such as near-field communication. For example, the radio frequency system 28 may include an NFC module (e.g., device) 30 that may enable the electronic device 10 to wirelessly communicate with another electric device, such as a standalone NFC device and/or another NFC module implemented in the other electronic device. In particular, to enable the electronic device to wirelessly communicate with another electronic device using contactless communication, the radio frequency system may include a radio frequency communication device, such as a radio frequency transceiver 32. Further, the NFC module 30 may transmit and receive data (e.g., information) to/from the network interface 24 that may be communicated to another electronic device capable of near-field communication.

Generally, the NFC module 30 may use electromagnetic (e.g., radio frequency) waves to wirelessly communicate the data. Additionally, the NFC module 30 may be implemented in a device acting as an active NFC reader (e.g., NFC module operating in an active NFC reader mode) that reads data from a device acting as a passive NFC tag (e.g., NFC module operating in a passive NFC tag mode). Additionally or alternatively, the NFC module 30 may be implemented in a device acting as a passive NFC tag that transmits information to a device acting as an active NFC reader. To facilitate operation modes of the NFC module 30, the NFC module 30 may be operably coupled to the processor core complex 18. The processor core complex 18 may act as an NFC controller that may control parameters of the NFC module 30, such as which preamble may be emitted based on the type of NFC protocol in use.

Figure 2:
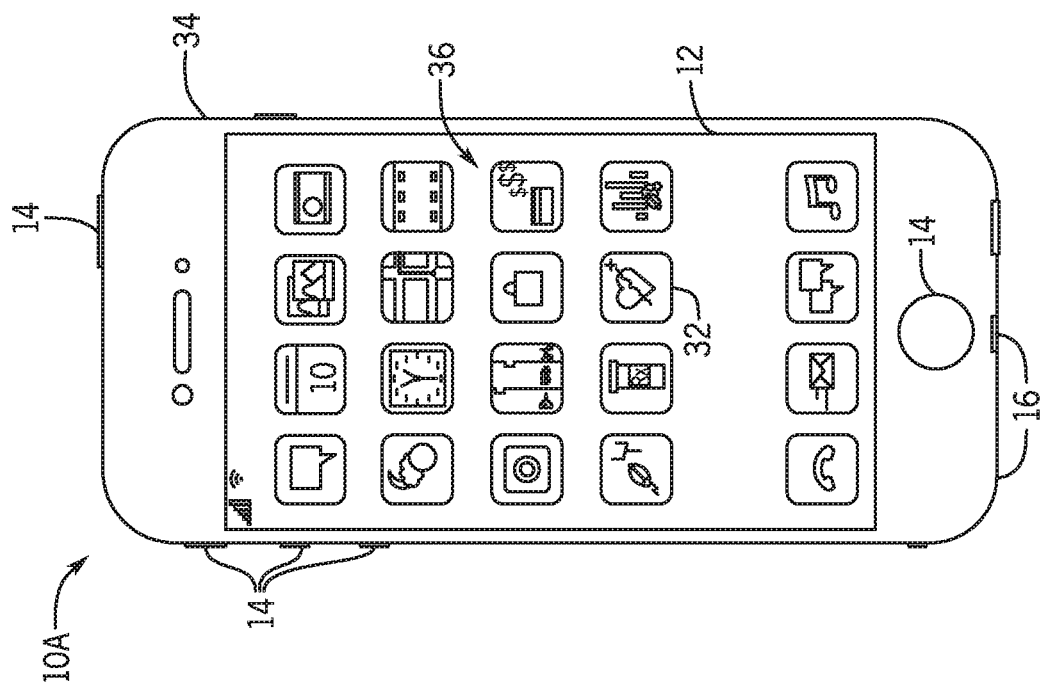
FIG. 2 is a front view of a hand-held device representing an example of the electronic device of FIG. 1, in accordance with an embodiment.

As described above, the electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For illustrative purposes, the handheld device 10A may be a smart phone, such as any iPhone® model available from Apple Inc.

As depicted, the handheld device 10A includes an enclosure 34 (e.g., housing). In some embodiments, the enclosure 34 may protect interior components from physical damage and/or shield them from electromagnetic interference. Thus, a radio frequency system 28 (not shown) may also be enclosed within the enclosure 34 and internal to the handheld electronic device 10A.

Additionally, as depicted, the enclosure 34 surrounds the electronic display 12. In the depicted embodiment, the electronic display 12 is displaying a graphical user interface (GUI) 36 having an array of icon. By way of example, when an icon is selected either by an input device 14 or a touch-sensing component of the electronic display 12, an application program may launch.

Furthermore, as depicted, input devices 14 open through the enclosure 34. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 34. In some embodiments, the I/O ports 16 may include, for example, a multi-function connector port (e.g., Lightning port) to connect to external devices.

Figure 3:
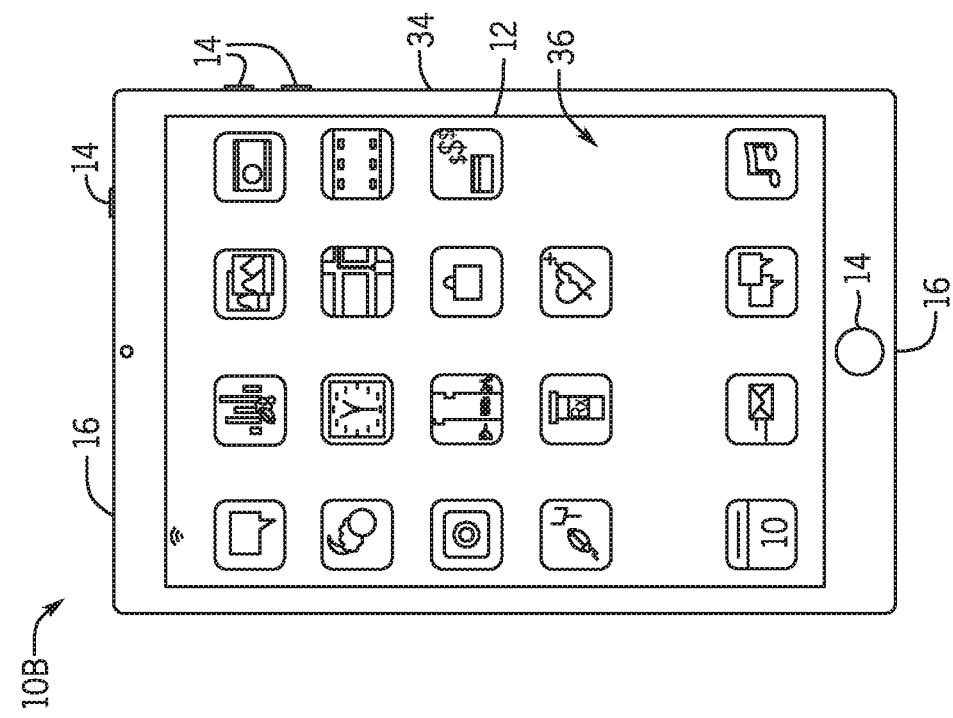
FIG. 3 is a front view of another hand-held device representing another example of the electronic device of FIG. 1, in accordance with an embodiment.
Figure 4:
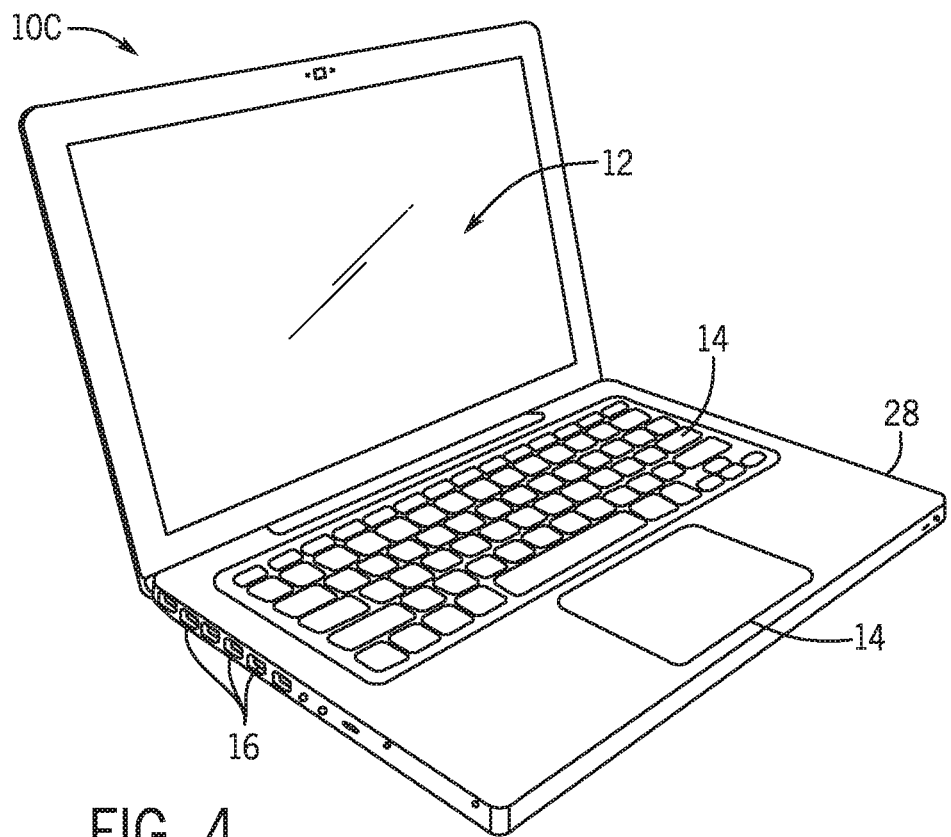
FIG. 4 is a perspective view of a notebook computer representing another example of the electronic device of FIG. 1, in accordance with an embodiment.
Figure 5:
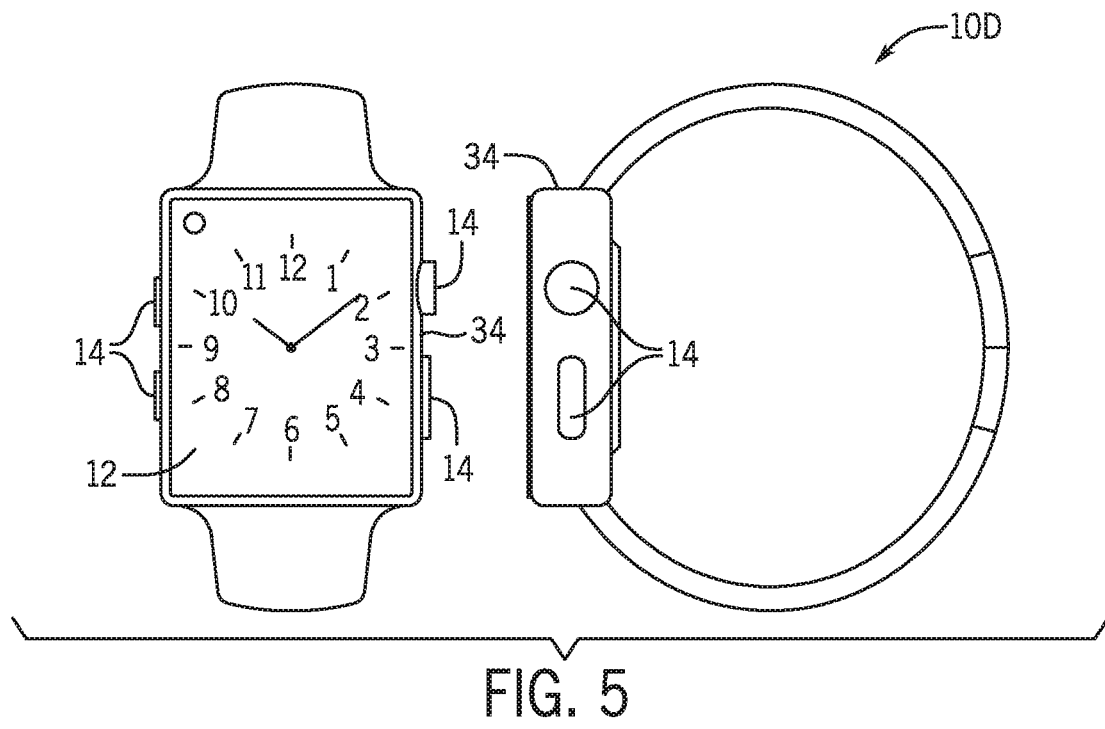
FIG. 5 is a front view of a wearable electronic device representing another example of the electronic device of FIG. 1, in accordance with an embodiment.

To further illustrate, another example of a suitable electronic device 10, specifically a tablet electronic device 10B is shown in FIG. 3. For example, the tablet electronic device 10B may be any iPad® model available from Apple Inc. A further example of a suitable electronic device 10, specifically a computer 10C, is shown in FIG. 4. For example, the computer 10C may be any Macbook® or iMac® model available from Apple Inc. Another example of a suitable electronic device 10, specifically a watch 10D, is shown in FIG. 5. For example, the watch 10D may be any Apple Watch® model available from Apple Inc.

The tablet electronic device 10B, the computer 10C, and the watch 10D may each also include an electronic display 12, input devices 14, I/O ports 16, and an enclosure 34. Thus, in some embodiments, the enclosure 34 may enclose a radio frequency system 28 in the tablet electronic device 10B, the computer 10C, and/or the watch 10D to facilitate wireless communication of data with other electronic devices and/or a network.

Figure 6:
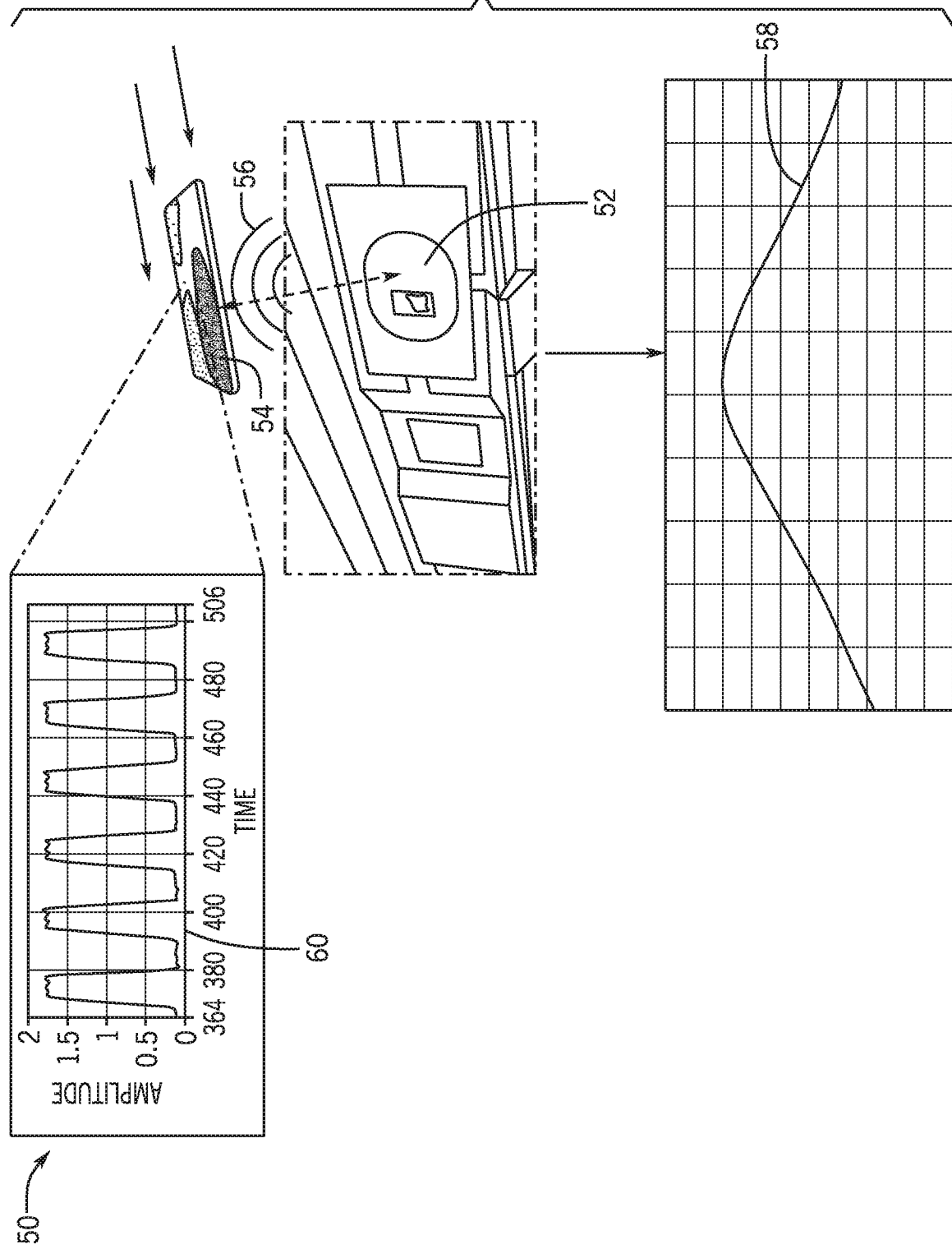
FIG. 6 is a schematic of a communication channel and a preamble waveform during appropriate coupling of contactless communication devices, in accordance with an embodiment.

To help illustrate the effect of appropriate and faulty coupling on the distortion of the communication channel, FIG. 6 illustrates an example of appropriate coupling 50 between the active NFC device 52 and the passive NFC device 54, in accordance with an embodiment. As shown, contactless communication via a near-field communication channel may occur between the active NFC device (e.g., rail station ticket kiosk) 52 and the passive NFC device (e.g., smartphone) 54. The active NFC device may emit polling electromagnetic NFC signals 56 into the surrounding environment to determine whether a potential NFC device (e.g., passive NFC device 54) is in proximity. Once the passive NFC device 54 is discovered, the active NFC device 52 and the passive NFC device 54 may be coupled and a communication channel may form between the NFC devices 52, 54. Once the communication channel has been formed and authenticated, communication (e.g., transaction) may begin between the passive NFC device 54 and the active NFC device 52. For example, the active NFC device 52 may send electromagnetic NFC signals 56 that include a preamble to the passive NFC device 54.

During appropriate coupling 50, environmental factors may not distort the communication channel 58 (e.g., smooth mapping of the communication channel 58). For example, there may be an appropriate amount of distance between the active NFC device 52 and the passive NFC device 54, the antenna of the active NFC device 52 may be placed appropriately, there are no electromagnetic interactions with a user, and the like. Further, because the communication channel 58 is not distorted, the electromagnetic NFC signals 56 transmitted via the communication channel 58 may also not be distorted. For example, the electromagnetic NFC signals 56 may include the preamble 60 for the NFC-F protocol and the preamble baseband signal waveform 60 may be free of distortion. That is, the preamble baseband signal waveform 60 is the expected filter response.

Figure 7:
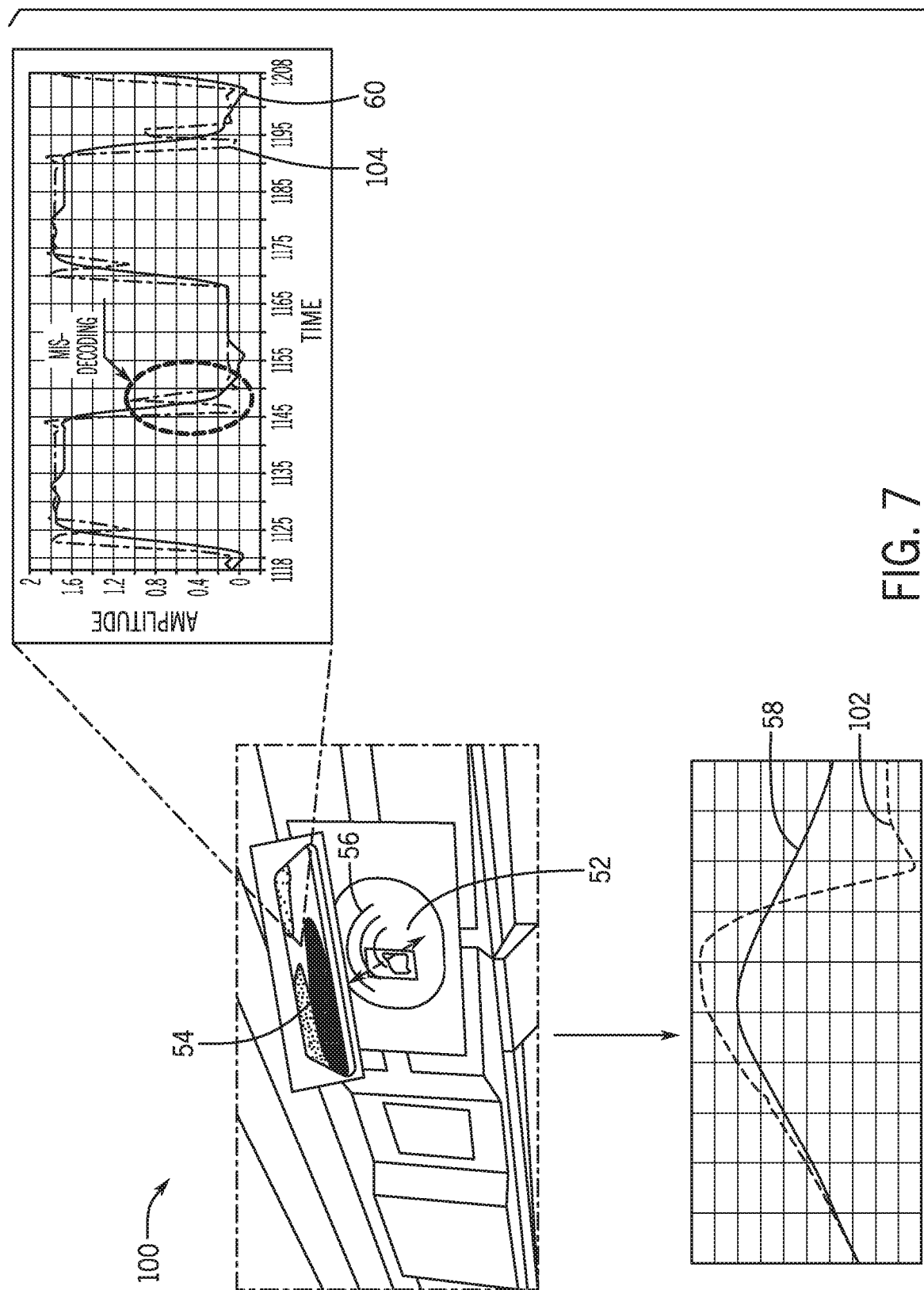
FIG. 7 is a schematic of the communication channel and the preamble waveform during faulty coupling of the contactless communication devices, in accordance with an embodiment.

On the other hand, FIG. 7 illustrates an example of faulty coupling 100 between the active NFC device 52 and the passive NFC device 54 that may be compensated for in accordance with an embodiment. As depicted, environmental factors may cause a distortion (e.g., non-smooth, interrupted mapping) of the communication channel 58, for example, due to close distance coupling between the active NFC device 52 and the passive NFC device 54. Further, because the communication channel 58 is distorted, the electromagnetic NFC signals 56 transmitted via the communication channel 58 may also be distorted. For example, the electromagnetic NFC signals 56 may include the preamble 104 for the NFC-F protocol and the preamble baseband signal waveform 104 is encoded with distortion. That is, the preamble baseband signal waveform 60 varies from the expected filter response and may be inappropriately decoded by the passive NFC device 54, resulting in communication failure. It should be appreciated that this communication failure may occur in one or more NFC operational modes, such as the polling mode and the reader (e.g., transaction) mode.

Figure 8:
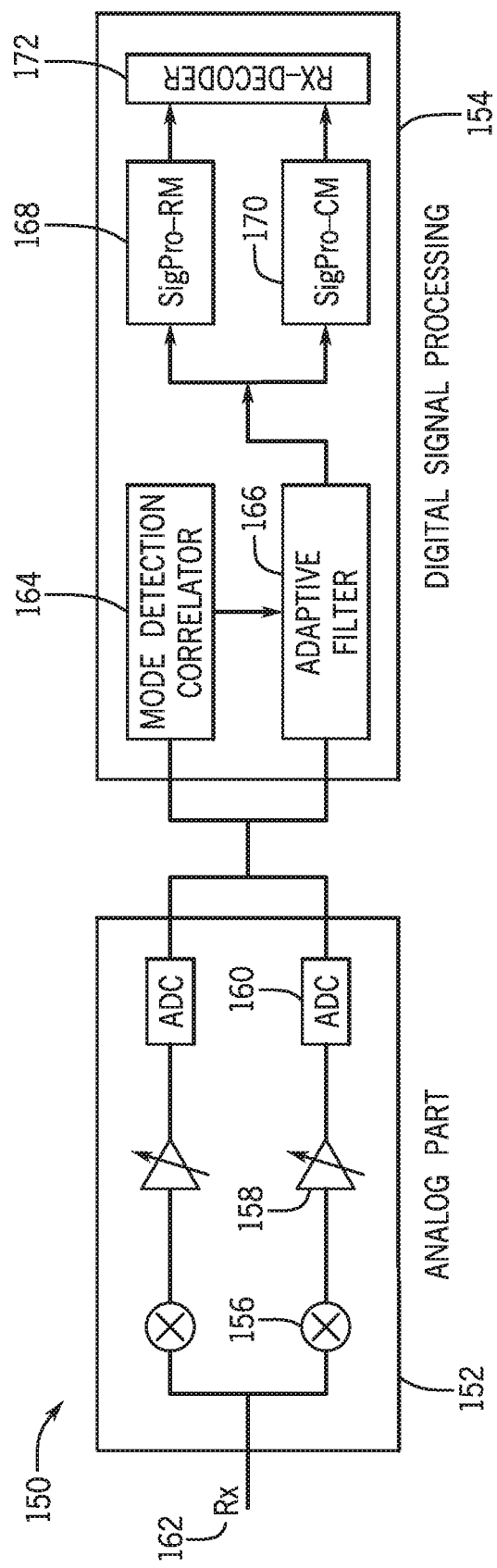
FIG. 8 is a block diagram of receiver architecture used to compensate for communication channel distortion caused by the faulty coupling of the contactless communication devices, in accordance with an embodiment.

To compensate for the communication channel distortion, receiver architecture 150 of the passive NFC device 54 may be implemented to perform a preamble-based channel estimation for NFC, as shown in FIG. 8 in accordance with an embodiment. The receiver architecture 150 may include an analog portion 152 and a digital signal processing (DSP) portion 154. The analog portion 152 may include one or more frequency mixers 156, one or more variable-gain amplifiers 158, and one or more analog-to-digital converters (ADC) 160. In particular, the analog portion 152 may receive an input signal 160 emitted by the active NFC device 52, and the input signal 160 may include a preamble 60. The input signal may be transmitted to the frequency mixers 156, which may output a signal with a new frequency to, for example, facilitate downstream signal processing. The input signal 160 may then be transmitted to the variable-gain amplifiers 158 for amplification that compensates for signal strength loss due to radio frequency components and signal processing. Further, the amplified signal may be digitized by the ADCs 160 to produce a digital signal that may be processed by the DSP portion 154.

In some embodiments, the DSP portion 154 may include a mode detection correlator 164, an adaptive filter 166, signal processing blocks 168, 170, and a receiving path decoder 172. The mode detection correlator 164 may receive the digitized signal, which includes the digitized preamble 60, from the analog portion 152. As previously mentioned, the digitized preamble may encode the NFC protocol type (e.g., NFC-A, NFC-B, NFC-F, NFC-V) that should be used by the passive NFC device 54 to appropriately decipher the electromagnetic NFC waves. As such, the digitized preamble 60 may have a different baseband waveform for each of the NFC protocol types.

The mode detection correlator 164 may analyze the baseband waveform and may determine the NFC protocol type encoded by the digitized preamble based on the baseband waveform features. In some embodiments, the mode detection correlator 164 may determine the NFC protocol type even from baseband waveforms that have been distorted during transmission via the distorted communication channel (e.g., 102). In particular, the mode detection correlator 164 may have enough tolerance to analyze rough approximations of the baseband waveform. Based on the determined NFC protocol type, the mode detection correlator 164 may transmit a baseband reference waveform (e.g., non-distorted preamble sequence) associated with the NFC protocol type to the adaptive filter 166 (e.g., 4-tap, flexible n-tap).

In addition to receiving the baseband reference waveform, the adaptive filter 166 may also receive the digitized preamble 60 from the analog portion 152. The adaptive filter 166 may compare the digitized preamble 60 and the baseband reference waveform to determine whether the digitized preamble 60, and hence the communication channel 58, have been distorted due to faulty coupling between the passive NFC device 54 and the active NFC device 52.

In some embodiments, when the communication channel 58 is distorted (e.g., baseband waveform of the digitized preamble 60 is choppy), the filter response of the adaptive filter 166 may be dynamically adjusted (e.g., train filter coefficients) based on the difference between the baseband waveform of the digitized preamble 60 and the baseband reference waveform to remove the communication channel distortion 102. That is, the adaptive filter 166 may undergo a learning process whereby the filter response is dynamically adjusted to converge to a channel estimate so that the baseband waveform of the digitized preamble 60 and the baseband reference waveform are substantially similar.

Once the filter response has been adjusted to converge the baseband waveform of the digitized preamble 60 to the baseband reference waveform as closely as desired, the adaptive filter 166 may output the relatively un-distorted filtered signal to one or more processing blocks, such as the reader mode signal processing block 168 and/or the card mode signal processing block 170. In particular, the reader mode signal processing block 168 may process electromagnetic NFC signals received when the passive NFC device 54 is acting as a reader for various NFC tags. The card mode signal processing blocks 170 may process electromagnetic NFC signals received when the passive NFC device 54 is acting in a card-emulation mode, such as when the passive NFC device 54 behaves like a contactless smart card during contactless transactions.

The one or more processing blocks 168, 170 may then output the processed signals to a radio frequency RX decoder 172, which may decode the encoded electromagnetic NFC signals. The radio frequency RX decoder 172 may subsequently output the decoded and relatively free-of-distortion electromagnetic NFC signal to additional processing blocks of the passive NFC device for further analysis.

As such, placement of the mode detection correlator 164 and the adaptive filter 166 before the one or more processing blocks 168, 170 may facilitate appropriately compensating for the communication channel distortion caused by faulty coupling. Indeed, the present receiver architecture may be able to identify the NFC protocol type and/or properly support communication even when the communication channel is distorted.

Figure 9:
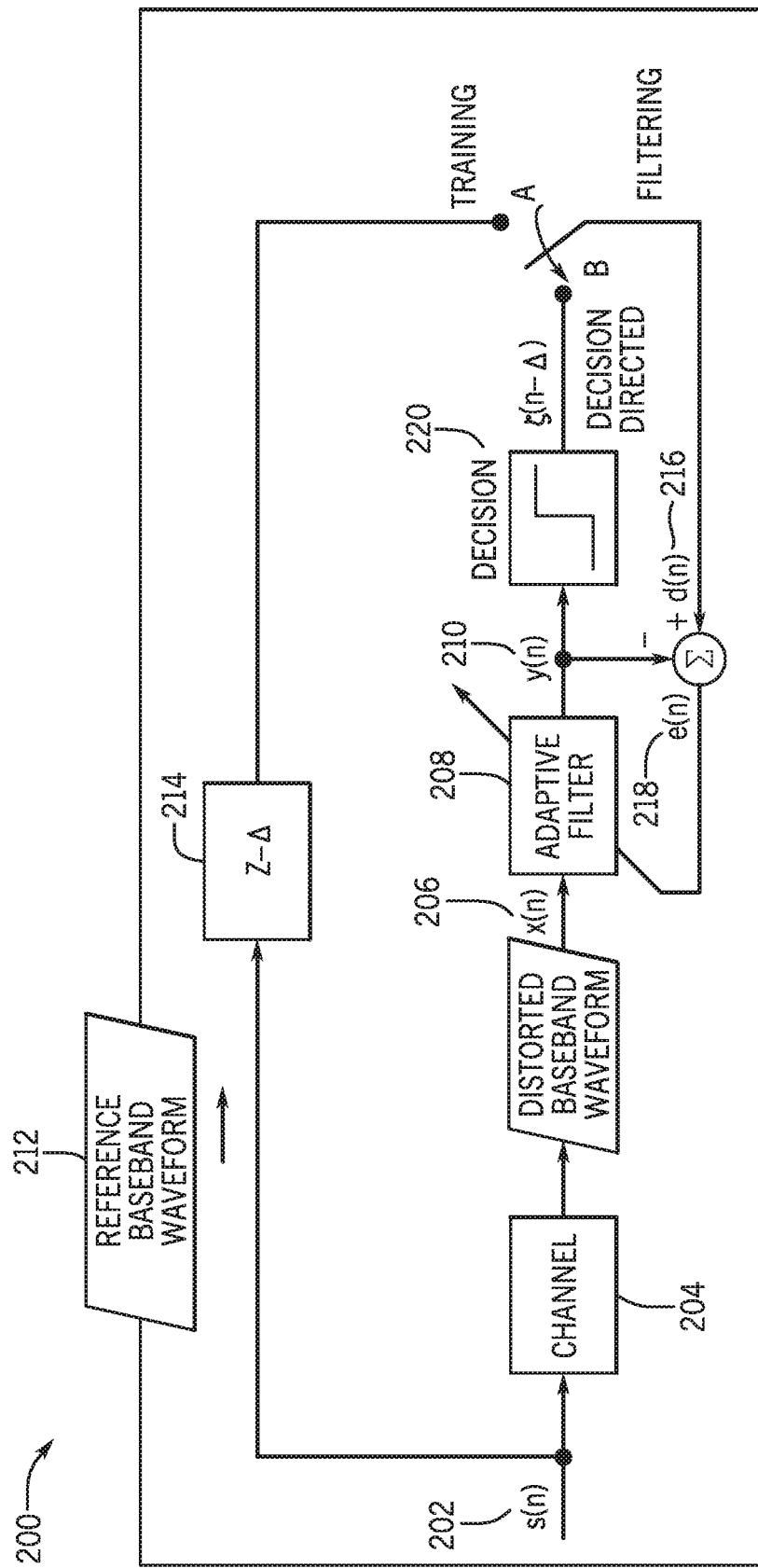
FIG. 9 is a block diagram of control operations used to train the receiver architecture of FIG. 8 to compensate for the communication channel distortion, in accordance with an embodiment.

To dynamically adjust the filter response to remove the communication channel distortion 102, the receiver 150 may be implemented as part of a control system 200, as shown in FIG. 9 in accordance with an embodiment. As depicted, the active NFC device 52 may emit an electromagnetic NFC wave (e.g., s(n) 202) to its surrounding environment. The passive NFC device 54 may receive the emitted signal 202 via the communication channel 204. When the communication channel 204 is distorted due to faulty coupling of the active NFC device 52 and the passive NFC device 54, the emitted signal 202 may also become distorted. For example, the distorted signal may be a distorted baseband waveform x(n) 206. The distorted baseband waveform 206 may then be transmitted to the adaptive filter 208 to generated a filtered baseband waveform y(n) 210. Additionally, the mode detection correlator 164 may determine an appropriate a reference baseband waveform 212, which may be inverted in a z-domain 214.

During the training phase, whereby the filter coefficients are adjusted to compensate for the communication channel distortion 102, the control system 200 may enter the training phase A. In particular, during the training phase, the filtered baseband waveform 210 and the reference baseband waveform 212 (e.g., d(n) 216) may be compared and an error e(n) 218 (e.g., difference between the filtered baseband waveform 210 and the reference baseband waveform 216) may be determined. The error 218 may be fed back to the adaptive filter 208 which may adjust the filter coefficients (e.g., estimate the channel) to reduce the error 218.

In some embodiments, a decision block 220 may drive the dynamic adjustment of the filter coefficients to reduce the difference between the filtered baseband waveform 210 and the reference baseband waveform 216 and thus, the error 218. For example, once the error 218 is within an error tolerance threshold range, the decision block 220 may switch to a filtering phase B so that the adaptive filter 208 may process received electromagnetic NFC signals. As such, the receiver control system 200 may use the baseband reference signal to train the adaptive filter 208 to counter the communication channel distortion impact on received signals. Further, the receiver control system 200 may enable self-adjustment of the filter response by adaptive filter 208.

Figure 10:
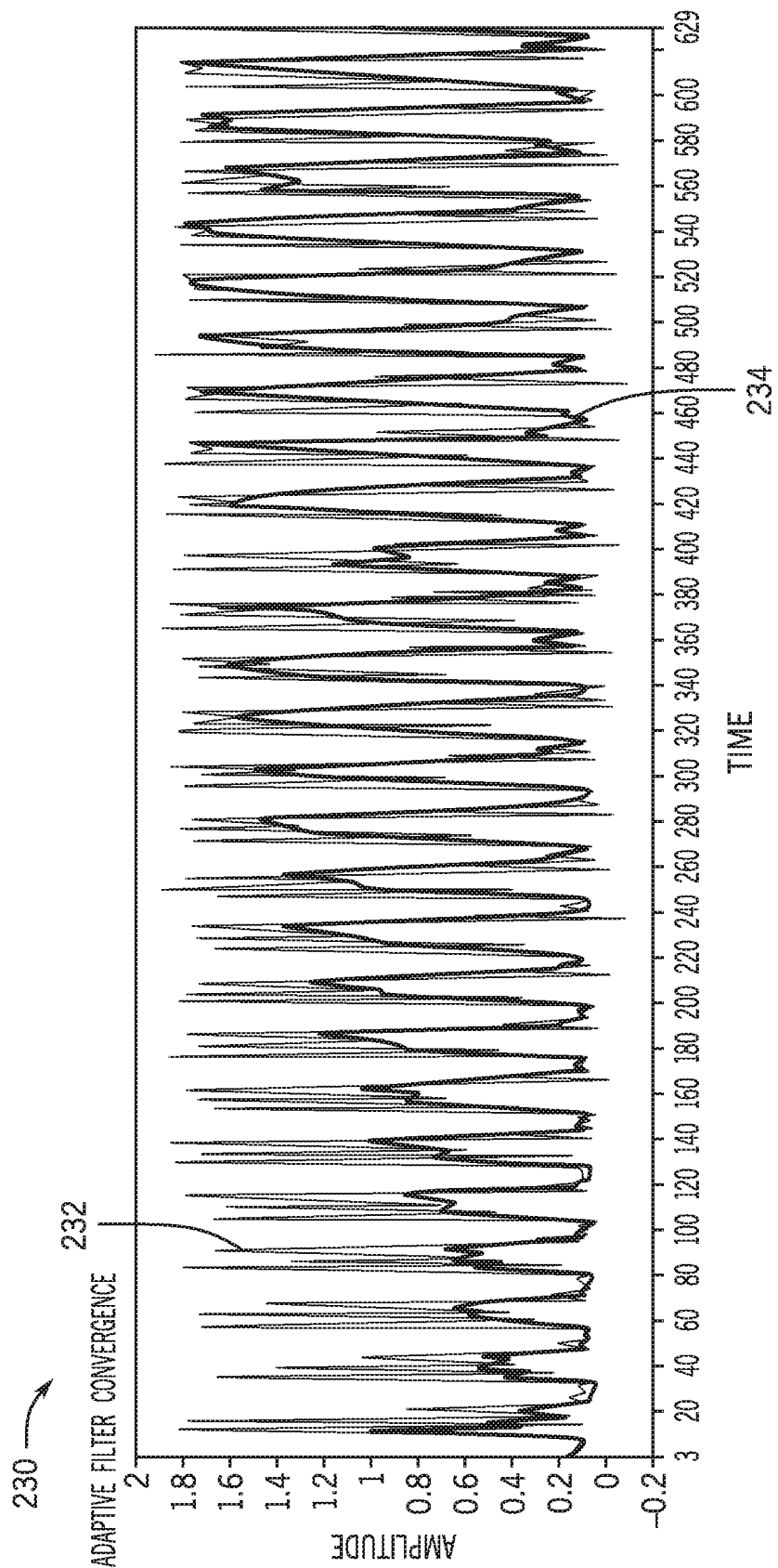
FIG. 10 is timing diagram depicting the training of the receiver architecture of FIG. 8, in accordance with an embodiment.

FIG. 10 depicts the training of the adaptive filter 166, such that the filter response 230 converges to the channel estimate, in accordance with an embodiment. As shown, the non-distorted, baseband reference signal 232 for a particular NFC protocol may be applied to the adaptive filter 166 to train and update the filter coefficients. With each iteration of the control system 200, the distorted baseband signal 234 may gradually converge towards the baseband reference signal 232. Thus, the adaptive filter 166 may estimate the communication channel and compensate for the communication channel distortion.

In some embodiments, the adaptive filter 166 may a flexible n-tap filter, such as a 4-tap adaptive filter 166, and the number of taps selected may be based on convergence time and accuracy. For example, an adaptive filter 166 with a greater number of taps may converge faster to the channel estimate, but may provide less accurate (e.g., undershoot, overshoot) channel estimation. As another example, an adaptive filter 166 with a fewer number of taps may converge slower to the channel estimate, but may provide a more accurate channel estimation.

Further, in some embodiments, the convergence of the distorted baseband signal 234 may be considered complete when a baseband reference signal threshold similarity is met by the convergence. That is, a difference tolerance between the baseband reference signal 232 and the distorted baseband signal 234 may be designated by the threshold. The tolerance may be changed based on system operations and in some embodiments, may either be changed prior to commencement of system operations or during system operations.

Figure 11:
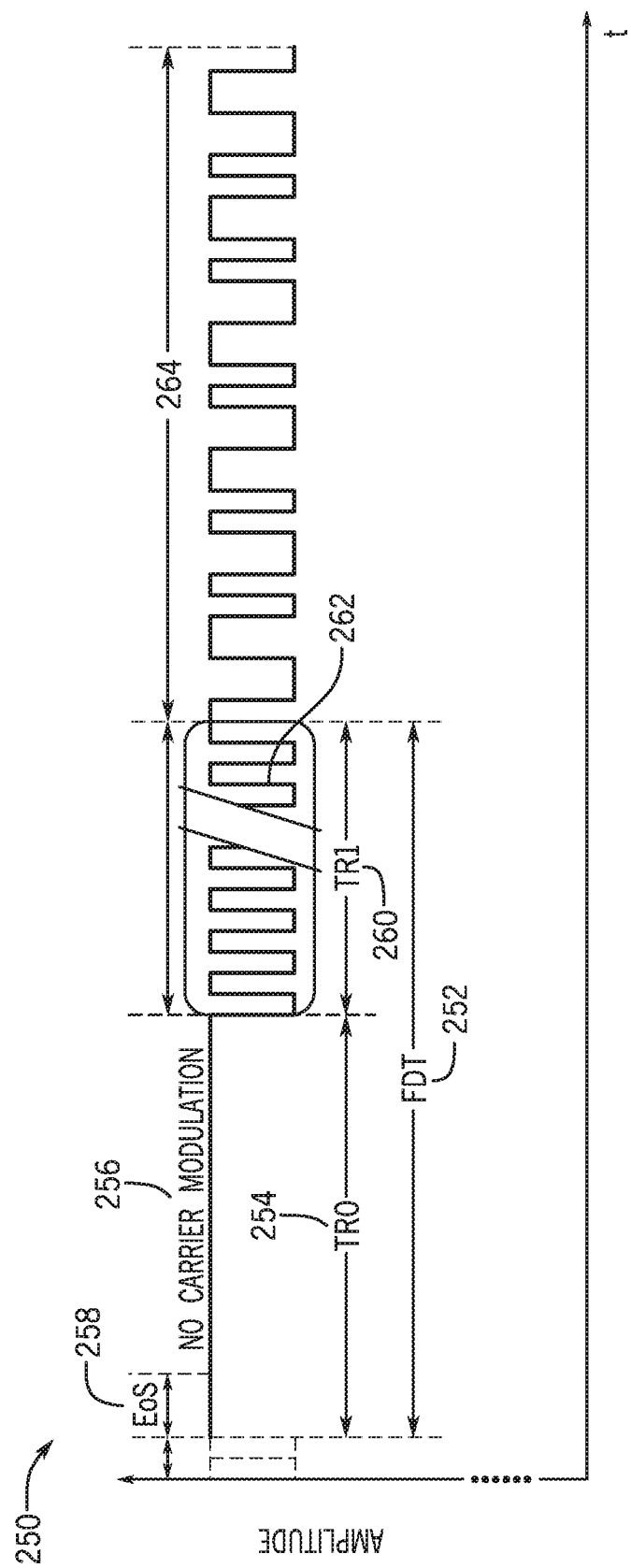
FIG. 11 is a timing diagram depicting the training of the receiver architecture for a particular contactless communication protocol encoded in the preamble, in accordance with an embodiment.

FIG. 11 depicts portions of an electromagnetic NFC signal frame 250 that may be used to train the adaptive filter 166, in accordance with an embodiment. For example, the NFC signal frame 250 may be modulated according to NFC-F protocol, which may be used when the passive NFC device 54 is operating in a reader mode or card mode. Briefly, the electromagnetic NFC signal frame 250 may include a frame delay time (FDT) portion 252. The FDT portion 252 may include a TR0 portion 254 that acts as a guard time between a first NFC signal frame and a second NFC signal frame. During the TR0 portion 254, no subcarrier (e.g., carrier modulation) may occur, as depicted by the flat signal line 256. The TR0 portion 254 may also include an end of sequence (EOS) 258 to designate the end of the first NFC signal frame.

The FDT portion 252 may also include a TR1 portion 260 that includes the preamble (e.g., start of sequence (SOS)) 262. The preamble 262 may include 48 modulation squares that represent the baseband waveform unique to the NFC protocol used. The preamble 262 may be used in adaptive filter training and due to its length, may be long enough for the filter response to converge to the channel estimate. The NFC signal frame 250 may also include a data portion (e.g., start of frame (SOF) 264) that may be modulated in accordance with the data emitted by the active NFC device 52.

Figure 12:
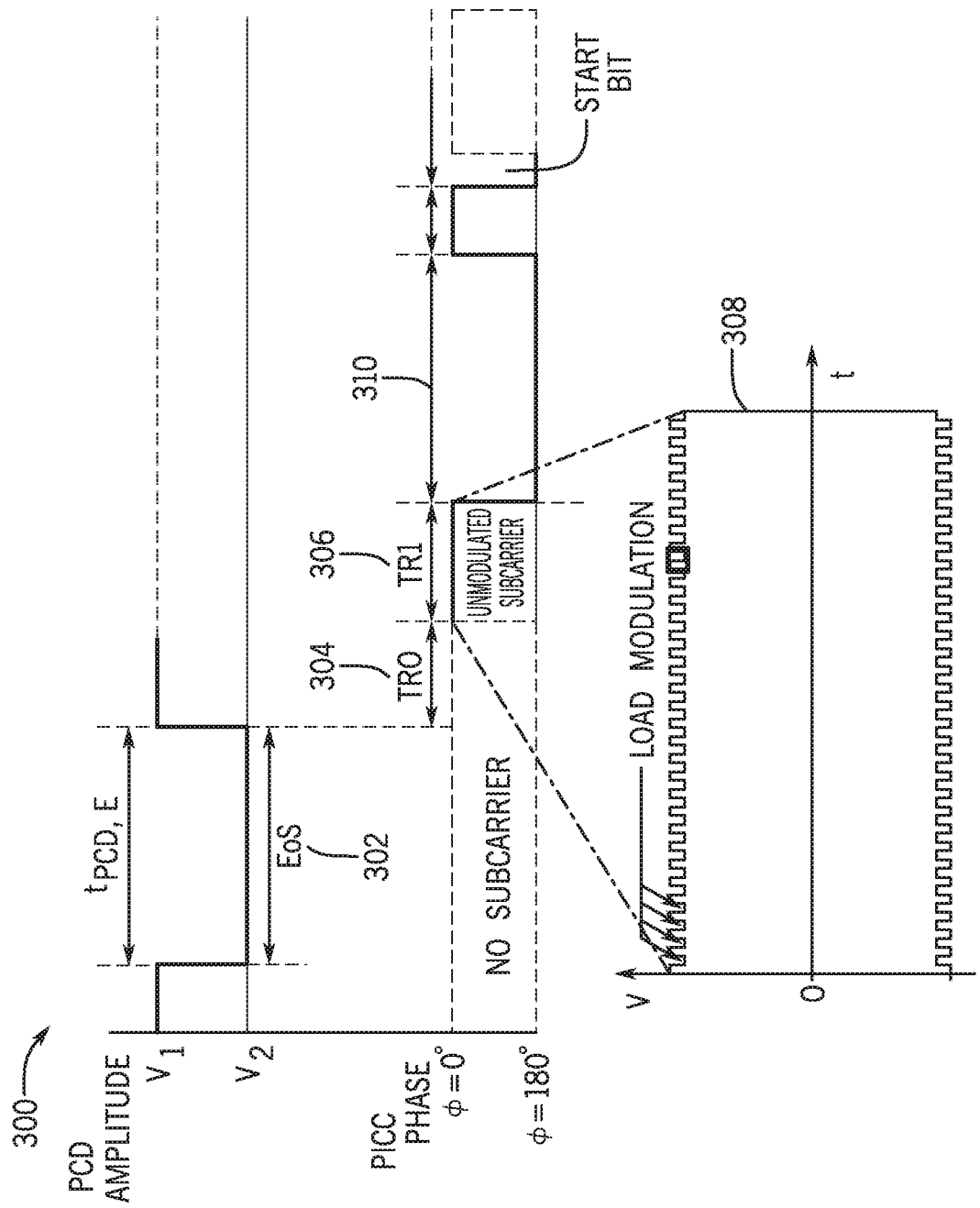
FIG. 12 is another timing diagram depicting the training of the receiver architecture for another contactless communication protocol encoded in the preamble, in accordance with an embodiment.

Additionally, FIG. 12 depicts portions of an electromagnetic NFC signal frame 300 that may be used to train the adaptive filter 166 for another NFC protocol, in accordance with an embodiment. For example, the NFC signal frame 300 may be modulated according to NFC-B protocol, which may be used when the passive NFC device 54 is operating as a reader receiver. The NFC signal frame 300 may include an end of sequence (EOS) 302 to designate the end of a first NFC signal frame and a second NFC signal frame. The NFC signal frame 300 may include a TR0 portion 304 during which subcarriers may not be generated.

Further, the NFC signal frame 300 may include a TR1 portion 306, which in turn may include generating unmodulated (e.g., no phase transition) subcarriers to establish an initial subcarrier phase reference. The TR1 portion 306 may include the preamble 308 used to train the filter response of the adaptive filter 166. In some embodiments, the preamble 308 may include a minimum of 32 unmodulated subcarriers to enable sufficient adaptive filter training. Additionally or alternatively, any portion of the NFC signal frame 300 that includes sufficient number of unmodulated subcarriers may be used as for the adaptive filter training. The NFC signal frame 300 may also include a data portion (e.g., start of start (SOS) 310) that may be modulated in accordance with the data emitted by the active NFC device 52.

Although FIG. 11 and FIG. 12 depict portions of an electromagnetic NFC signal frame that may be used to train the adaptive filter 166 for certain NFC protocols, it should be appreciated that the present disclosure contemplates use of electromagnetic NFC signal frames modulated via other NFC protocols (e.g., NFC-A, NFC-V) to train the adaptive filter 166. Further, it should be understood that the signal portions used to train the adaptive filter 166 may be of a shorter or longer sequence than described herein.

Figure 13:
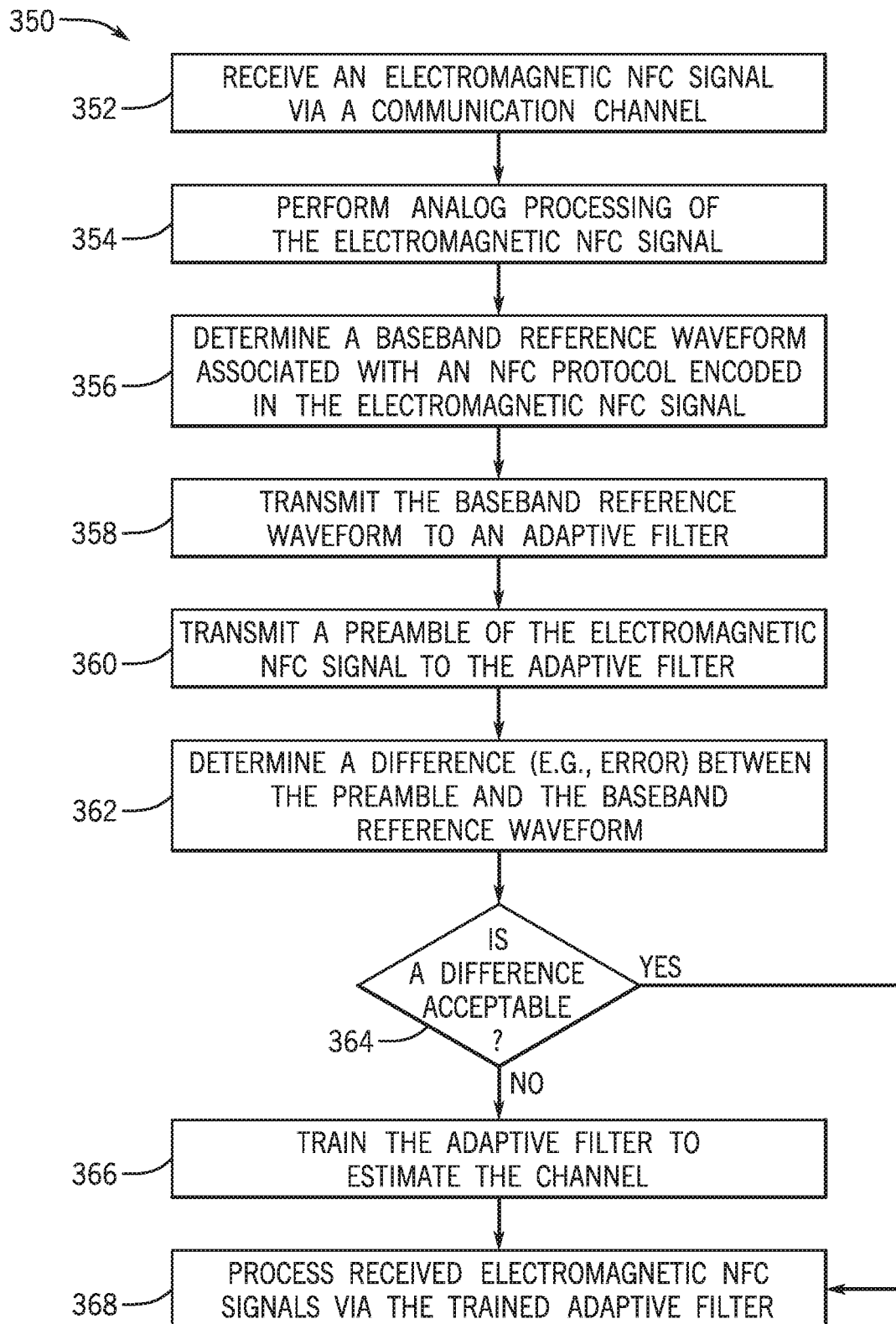
FIG. 13 is a process for operating the receiver to compensate for the communication channel distortion, in accordance with an embodiment.

A process 350 for operating the receiver 150 to compensate for the communication channel distortion 102 is described in FIG. 13, in accordance with an embodiment. While process 350 is described according to a certain sequence, it should be understood that the present disclosure contemplates that the described steps may be performed in different sequences than the sequence illustrated, and certain described steps may be skipped or not performed altogether. In some embodiments, the process 350 may be implemented at least in part by executing instructions stored in a tangible, non-transitory, computer-readable medium, such as the memory 20, using processing circuitry, such as the processor core complex 18 or a separate controller designated for the radio frequency system. Additionally or alternatively, the process 350 may be implemented at least in part by circuit connections and/or control logic implemented in an electronic device 10.

Generally, the process 350 may be initiated when an electromagnetic NFC signal is received by the passive NFC device 54 via the communication channel 58 (process block 352). For example, a smartphone may operate as a passive NFC device 54 in card-emulation mode and may receive the electromagnetic NFC signal emitted by the active NFC device 52, such as a rail station ticket kiosk. The passive NFC device 54 may then perform analog process of the electromagnetic NFC signal (processing block 354). Continuing the example, the analog receiver portion 152 of the smartphone may amplify and digitize the electromagnetic NFC signal.

Further, the passive NFC device 54 may determine a baseband reference waveform associated with an NFC protocol encoded in the electromagnetic NFC signal (process block 356). As an example, the rail station ticket kiosk may emit the electromagnetic NFC signal using the NFC-F protocol and the protocol that should be used by the smartphone to decipher the electromagnetic NFC signal may be encoded in the preamble 60 of the electromagnetic NFC signal. The mode detection correlator 164 of the smartphone may analyze the preamble 60 to determine the appropriate NFC protocol. Further, the mode detection correlator 164 may determine the baseband reference waveform (e.g., un-distorted preamble) that should have been received for this NFC protocol when the communication channel 58 is not distorted.

The mode detection correlator 164 may transmit the baseband reference waveform to the adaptive filter 166 (process block 358). Additionally, the adaptive filter 166 may also receive the preamble 60 digitized by the analog receiver portion 152 (process block 360). A receiver control system 200 that includes the adaptive filter 166 may determine that a difference (e.g., error) exists between the preamble 60 and the baseband reference waveform and whether the difference is within an acceptable error range (process block 362, decision block 364).

When the difference is within an acceptable error range (e.g., the preamble is sufficiently similar to the baseband reference waveform and no distortion exists), received electromagnetic NFC signals may be processed by the adaptive filter 166, where the adaptive filter 166 has already been trained to estimate the channel 58 (process block 368). When the difference is not within an acceptable error range (e.g., the preamble is sufficiently different to the baseband reference waveform and distortion exists, due to, for example, poor placement of the smartphone on the rail station ticket kiosk), the adaptive filter 166 may be trained or retrained to estimate the channel 58 and to converge the preamble 60 to the baseband reference waveform (process block 366).

By employing the techniques described above, the radio frequency system 28 may compensate for the distortion of a contactless communication channel 58 arising from faulty coupling between the electronic devices 10. As such, the present techniques may improve reliability of the contactless communication.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device having a radio frequency system comprising:
   an antenna configured to receive data using near-field communication (NFC); and
   NFC signal processing circuitry configured to:
      receive an electromagnetic NFC signal via a communication channel formed between the electronic device and an other electronic device via the antenna;
      evaluate the electromagnetic NFC signal to identify one NFC communication protocol of a plurality of NFC communication protocols used by the electromagnetic NFC signal; and
      adaptively estimate, as an adaptive estimation, the communication channel based, at least in part, on the identified one NFC communication protocol.

2. The electronic device of claim 1, wherein the one NFC communication protocol is identified using a plurality of stored reference signals corresponding to at least some of the plurality of NFC communication protocols.

3. The electronic device of claim 1, wherein a filter response of the NFC signal processing circuitry is trained to estimate the communication channel.

4. The electronic device of claim 3, wherein the filter response of the NFC signal processing circuitry is retrained to estimate the communication channel in response to the evaluated electromagnetic NFC signal being outside a threshold error when identifying the electromagnetic NFC signal to the one NFC communication protocol.

5. The electronic device of claim 1, wherein the NFC signal processing circuitry compensates for distortion of the communication channel using the adaptive estimation of the communication channel.

6. The electronic device of claim 1, wherein the plurality of NFC communication protocols define transmission criteria between the electronic device and the other electronic device.

7. The electronic device of claim 1, the plurality of NFC communication protocols comprises NFC-A, NFC-B, NFC-F, NFC-V, or a combination thereof.

8. The electronic device of claim 1, wherein adaptively estimating comprises training an adaptive filter, comprising:
   generating a filtered baseband waveform of the electromagnetic NFC signal;
   determining a reference baseband waveform based on the electromagnetic NFC signal;
   determining an error between the filtered baseband waveform and the reference baseband waveform;
   adjusting filter coefficients of the radio frequency system based, at least in part, on the error; and
   updating the filter coefficients.

9. The electronic device of claim 1, wherein the electronic device comprises a mobile device and the other electronic device comprises a ticket kiosk.

10. An electronic device having a radio frequency system comprising:
    an antenna configured to transmit or receive data using near-field communication (NFC); and
    NFC signal processing circuitry configured to:
       receive an electromagnetic NFC signal via a communication channel formed between the electronic device and an other electronic device via the antenna,
       determine a baseband reference waveform associated with the electromagnetic NFC signal, and
       estimate the communication channel based, at least in part, on the baseband reference waveform and the electromagnetic NFC signal.

11. The electronic device of claim 10, wherein estimating the communication channel comprises:
    determining an error between a portion of the electromagnetic NFC signal and the baseband reference waveform;
    in response to the error being within an acceptable error threshold range, estimating the communication channel without training a filter response of the NFC signal processing circuitry; and
    in response to the error being outside of the acceptable error threshold range, training the filter response of the NFC signal processing circuitry.

12. The electronic device of claim 11, wherein determining the error between the portion of the electromagnetic NFC signal and the baseband reference waveform comprises determining a difference between the electromagnetic NFC signal and the baseband reference waveform.

13. The electronic device of claim 11, wherein the portion of the electromagnetic NFC signal comprises a preamble unique to a NFC protocol type, wherein the preamble comprises a baseband waveform of unmodulated subcarriers.

14. The electronic device of claim 10, wherein estimating the communication channel comprises identifying one communication protocol of a plurality of communication protocols.

15. The electronic device of claim 14, wherein the one communication protocol provides compatibility between the electronic device and the other electronic device to synchronize transmission times, read times, or a combination thereof.

16. The electronic device of claim 10, wherein estimating the communication channel comprises removing channel distortion.

17. A method comprising:
    receiving an electromagnetic signal as a received electromagnetic signal, at a first electronic device from a second electronic device via a wireless communication channel that is distorted due to movement of the first electronic device with respect to the second electronic device;
    identifying an expected preamble as an identified expected preamble, of the electromagnetic signal from among a plurality of defined possible preambles; and
    performing channel estimation for the wireless communication channel at least in part based on a difference between the identified expected preamble and the received electromagnetic signal.

18. The method of claim 17, wherein performing channel estimation comprises training filter coefficients of an adaptive filter.

19. The method of claim 18, wherein the trained filter coefficients are updated based, at least in part, on the identified expected preamble being outside a threshold from the expected preamble.

20. The method of claim 18, wherein the plurality of defined possible preambles correspond to a plurality of contactless communication protocols.

* * * * *